United States Patent [19]

Hinton

[11] Patent Number: 4,639,675
[45] Date of Patent: Jan. 27, 1987

[54] SUPERCONDUCTING CONDUCTIVITY ANOMALY DETECTION SYSTEM

[75] Inventor: George F. Hinton, Bay St. Louis, Miss.

[73] Assignee: The United States of America as represented by the Secretary of the Navy, Washington, D.C.

[21] Appl. No.: 629,936

[22] Filed: Jul. 11, 1984

[51] Int. Cl.$^4$ .................... G01V 3/165; G01R 33/035
[52] U.S. Cl. .................................. 324/334; 324/248; 324/326; 324/345; 335/216
[58] Field of Search ............................... 324/330–332, 324/334, 335, 345, 346, 326, 329, 220, 221, 248; 335/216

[56] References Cited

U.S. PATENT DOCUMENTS

| | | | |
|---|---|---|---|
| 2,527,170 | 10/1950 | Williams | 324/221 |
| 3,105,934 | 10/1963 | Barringer | 324/4 |
| 3,361,964 | 1/1968 | Hanson et al. | 324/220 X |
| 3,538,431 | 11/1970 | Moss | 324/6 |
| 3,836,841 | 9/1974 | Morrison | 324/5 |
| 3,950,695 | 4/1976 | Barringer | 324/3 |
| 4,165,480 | 8/1979 | Morrison | 324/6 |
| 4,228,395 | 10/1980 | Dusheck | 324/77 |
| 4,437,064 | 3/1984 | Overton, Jr. et al. | 324/346 |

Primary Examiner—Gerard R. Strecker
Attorney, Agent, or Firm—R. F. Beers; T. M. Phillips

[57] ABSTRACT

A conductivity anomaly detection system uses a rotating superconducting magnet to generate a known source field and an integrated detection system rotating with the superconducting magnet to detect anomalies in the generated source field caused by nearby conducting targets. The superconducting magnet is rigidly mounted in a Dewar which is in turn mounted on a shaft. An orthogonal detection system also is rigidly mounted on or within the Dewar with the superconducting magnet. The second harmonic of the anomaly signal from a target is detected for signal processing.

7 Claims, 3 Drawing Figures

SUPERCONDUCTING CONDUCTIVITY ANOMALY DETECTION SYSTEM

BACKGROUND OF THE INVENTION

1 Field of the Invention

The present invention relates to conductivity anomaly detection systems, and more particularly to a superconducting conductivity anomaly detection system using a rotating superconducting magnet as a transmitter and a plurality of superconducting quantum interference field detectors (SQUIDS) having their detection coils rotating with the superconducting magnet as a receiver to detect the second harmonic of the rotation frequency.

2. Description of the Prior Art

A conductivity anomaly detection (CAD) system detects anomalies produced in the time varying magnetic field of a controllable source, which anomalies are created by a target of high conductivity. In the case of submarines the highly conducting target is itself in a background, the ocean, which has moderate conductivity. A CAD system has advantages such as (a) less susceptibility to external noise sources since it operates in a very low frequency range where there is less noise, (b) the ability to measure depth of the target since the phase of the return signal is a function of depth below the surface, and (c) the capability of localizing a target since the CAD frequency is fixed. Such a CAD system is limited by the strength of the magnets which generate the known source field which in turn requires a detector of extreme sensitivity, i.e. a superconducting magnetometer (SQUID).

The CAD system is an "active" search system which means a controllable signal source is used to determine the location of a target. The operational frequency is very low so the detector must measure slight changes in impedance rather than a reflected electromagnetic wave. Alternating fields are set up by a strong source magnet which is driven at a fixed frequency. When a conducting target is present, the alternating fields around it induce currents which in turn produce weak new fields. The weak new fields are detected as a small anomaly in the field pattern of the source.

Many airborne electromagnetic prospecting and detection systems have been devised and employed for years to detect conducting mineral deposits in the earth, a background which has virtually zero conductivity. Some major problems common to all such systems include: how to generate large amounts of transmitted power to achieve long range and depth penetration; how to separate a small target signal from this large transmitted power; and how to separate the small target signal from other large signals that also originate in the environment.

Rotating magnetic fields have been generated with two orthogonal coils fixed to an aircraft and driven in phase quadrature. Detection was accomplished by coils in a towed bird some distance behind and below the aircraft. This system, first tested over thirty years ago, is of negligible value due to the irregular motion of the detection coils in the earth's magnetic field and the undesired coupling between the transmitting and detecting coils.

SUMMARY OF THE INVENTION

Accordingly, the present invention provides a superconducting conductivity anomaly detection system having a rotating superconducting magnet for generating a known source field and superconducting magnetometers (SQUIDS), the detection coils of which are rigidly connected to and rotating with the superconducting magnet, for detecting anomalies in the generated source field. The superconducting magnet is rigidly mounted in a Dewar which is rotated on a hollow shaft to create a rotating di-pole moment in a vertical plane. Three orthogonal, cryogenic d.c. transformer loops, mounted to rotate with the superconducting magnet, are connected to three independent SQUIDS. Due to the reversal of polarity of the transformer loops with each half-cycle of rotation, the anomaly signal occurs as the second harmonic of the rotation frequency. This enables distinguishment between the signal from a target and the noise induced by the earth's magnetic field which occurs at the rotation frequency.

Therefore, it is an object of the present invention to provide a conductivity anomaly detection system which generates a high power known source field to detect conductive bodies.

Another object of the present invention is to provide a conductivity anomaly detection system which reduces requirements for power for the known source field.

Yet another object of the present invention is to provide a conductivity anomaly detection system which eliminates the strong sea return and effect of the earth's magnetic field to increase the signal-to-noise ratio.

Still another object of the present invention is to provide a conductivity anomaly detection system which eliminates the interferenc between the large transmitted signal and the small target signal.

Other objects, advantages and novel features will be apparent from the following detailed description when read in conjunction with the appended claims and attached drawing.

DESCRIPTION OF THE PREFERRED EMBODIMENT

Figure 1:
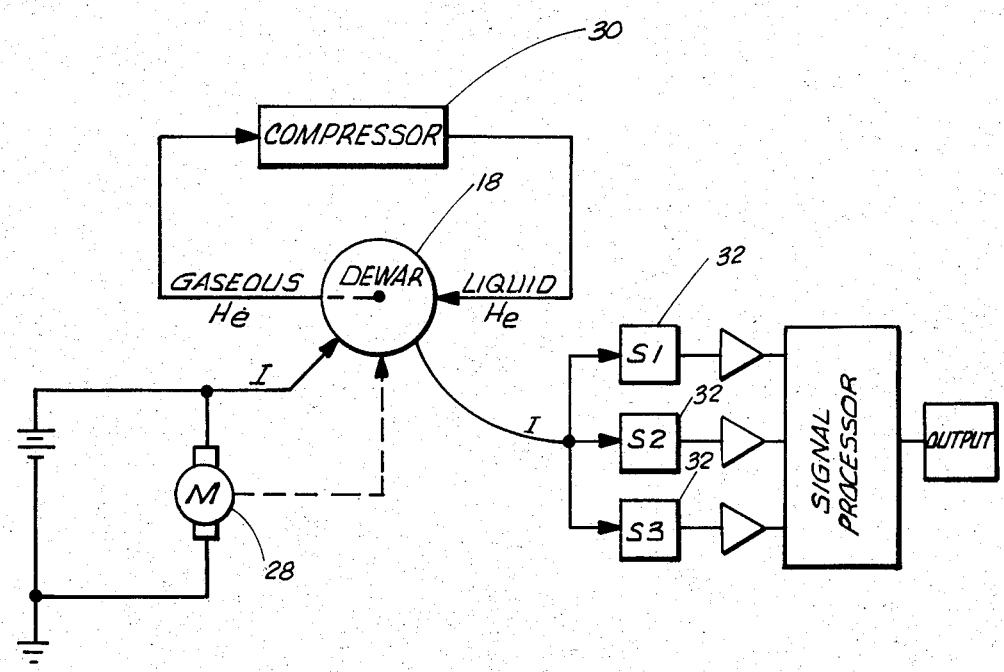
FIG. 1 is a block diagram of a superconducting conductivity anomaly detection system.
Figure 2:
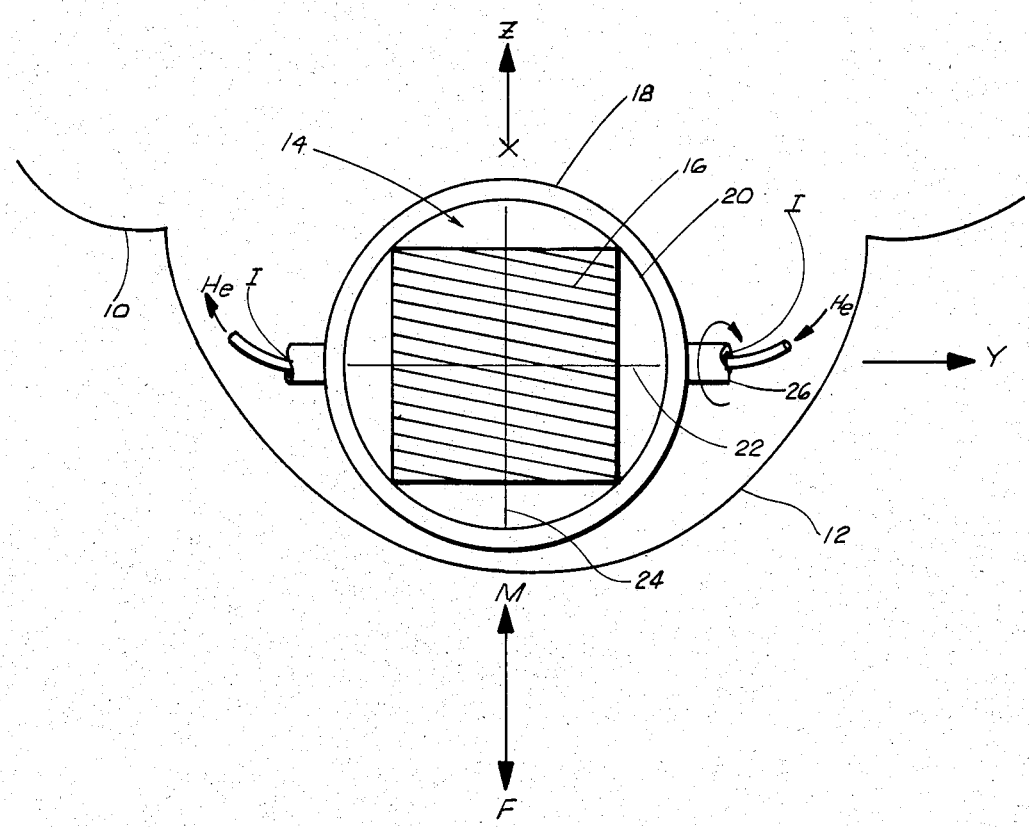
FIG. 2 is a schematic view of a superconducting conductivity anomaly detection system.

Referring now to FIGS. 1 and 2 a superconducting conductivity anomaly detection (CAD) system according to the present system is shown in a vehicle 10, such as an aircraft, helicopter, ship or the like, embedded in a rectangular Cartesian coordinate system. X is horizontal in the direction of movement of the vehicle 10, Y is horizontal and orthogonal to X, and Z is vertical and orthogonal to both X and Y. A non-conducting housing 12 protrudes from the vehicle 10 and contains the sensors for the CAD system. The housing 12 may be a boom, a towed vehicle, a blister or the like. Ideally the vehicle 10 itself is non-conductive, but this known conductivity can be accounted for in the signal processing. A superconducting magnet 14 having a plurality of superconducting windings 16 is rigidly fixed within a Dewar 18 by an appropriate framework (not shown). M is the di-pole moment vector of the superconducting magnet 14 and F is the vector corresponding to the total magnetic field of the earth, shown vertical for convenience. A set of orthogonal detection coils 20, 22, 24 is also rigidly mounted within the Dewar 18, the axes of the coils corresponding to the X, Y, Z coordinate system. The Dewar 18 is mounted on a hollow shaft 26. The hollow shaft 26 is rotatably mounted in the nonconducting housing 12 so that the Dewar 18 together with the superconducting magnet 14 and all other systems within the Dewar are rigidly rotated in the direction of flight around the Y-axis. Thus, the di-pole moment, M, is rotated in the vertical X-Z plane in the line of movement of the vehicle 10. This creates a rotating magnetic field in the vicinity of the vehicle 10 which decays with distance according to the di-pole inverse cube law.

The orientation support and stabilization of this rotating system is by means of appropriate bearings, yokes, gimbals or other support and control structures well known in the art that are ultimately referred to a rigid directional reference within the vehicle 10. Power to rotate the system is supplied from a motor 28 from within the vehicle 10 by means of such power transmission devices as shafts, gears, flexible shafts, fluid drive mechanisms or the like, also well known in the art. Such support, control and power transmission sub-systems do not use either electrical currents or magnetic materials. Liquid helium, He, is injected into the rotating Dewar 18 through the hollow shaft 26 and gaseous helium, He, is vented also via the hollow shaft. The vented gas is passed through a helium compressor 30 and back to the Dewar 18 to form a continuous cryogenic circuit. Due to the pressure gradients induced by rotation, a gaseous cavity forms at the center of the Dewar 18, and it is from this region that the gas is vented. Electrical connection to the detection coils 20, 22, 24 inside the Dewar 18 is indicated by I. These circuits may also be superconducting, and thus may be contained within the tubing that carries the helium. Electrical connection internal to the Dewar 18 is accomplished with slip-rings or equivalent.

The transmitted rotating magnetic field, M, induces electrical currents in all conducting bodies, such as a submarine 42 in the ocean 44, within its range. These currents have their own magnetic fields and serve as means for detecting these bodies. The coils 20, 22, 24 are three orthogonal, cryogenic d.c. transformer loops connected to three independent superconducting magnetometers (SQUIDs) 32. The SQUIDs may be within the Dewar 18 or, if I is superconducting, outside within the vehicle 10. The SQUIDs are magnetically shielded.

Since the coils 20, 22, 24 are rotating with the superconducting magnet 14, they do not measure the periodic motion of the rotating transmitted magnetic field, M. Coils 20 and 22 do not detect the sinusoidal component of target fields rotating in the X-Z vertical plane in the same direction and at the same frequency as the superconducting magnet 14. However since target bodies are of irregular shape, distribution and conductivity, harmonics of the fundamental rotational frequency are generated in these coils 20 and 22, especially of interest being the second harmonic. The ocean 30 also generates a characteristic spectrum dependent upon the orientation of the rotational axis, as does the target 28. It is the task of signal analysis to separate the small signal of the target 28 from the much larger signal of the ocean 30, a problem common to all methods of detection.

An additional noise source is the vertical component of the earth's magnetic field, F, which generates a large signal in the coils 20, 22. This signal is at the frequency of rotation, so standard frequency separation methods, such as filtering, minimize this source of noise. With advanced signal processing methods and good attitude of the rotating system, targets 42 in the ocean 44 are detected.

Another mode of operation makes use of the third coil 24 rotating in the X-Z plane. Such a coil 24 orthogonal to the axis of rotation does not detect the earth's magnetic field, F, regardless of the orientation of the rotation axis. The signals of the rotating magnetic fields induced in the ocean 44 cancel in this third coil 24 due to symmetry. This is not true for the target 42 out of the X-Z plane. The system thus becomes a side-looking detection system, and with a frequency of rotation as low as 1 Hz, feasible with a slow moving vehicle such as a helicopter or ship, depth of penetration into the ocean 44, i.e., detection range, can be maximized.

Additionally to map the sea bottom 46 to substantially greater depths a "canted" mode of operation may be used. By rotating the system in the Y-Z plane to an intermediate position, such as 45° from the horizontal, the earth's magnetic field at the fundamental frequency still cancels in the third coil 24, but the signal from the oceans 44 is no longer symmetrical and the large amplitude of the fundamental frequency can be used.

Figure 3:
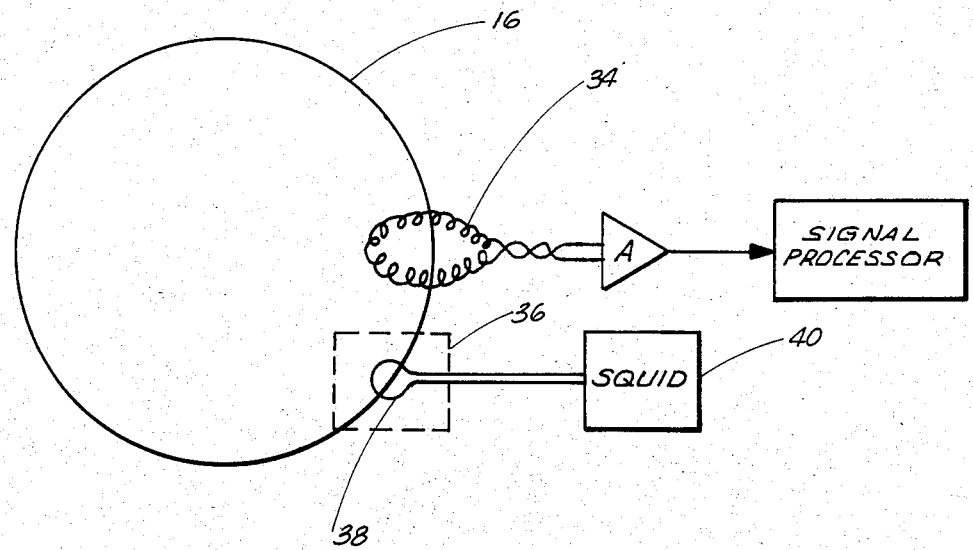
FIG. 3 is a schematic view of alternative detection schemes for a superconducting conductivity anomaly detection system.

In the ultimate case as shown in FIG. 3 the superconducting winding 16 of the superconducting magnet 14 may itself be used as the detecting coil. The alternating fields of the signal from the target 42 would be superimposed upon the steady persistent current of the superconducting winding 16. A noise-cancelling transformer 34 is used to sense the induced a.c. signal in the superconducting winding 16 without interrupting the persistent current. A toroidal transformer 34, uniformly wound to cancel such external signals, may be used with its axis corresponding to the line integral around the persistent current. Alternatively, one or more windings of the superconducting magnet 14 may be led into a small magnetic shield 36 where fluctuations of the persistent current may be sensed by the cryogenic d.c. transformer loop 38 of a SQUID 40.

The conductivity anomaly detection system as described above is a complete cryogenic system for maximum sensitivity. However tor less sensitive applications room-temperature magnetometers may be used in lieu of the SQUIDs. Any orthogonal set of vector magnetometers may be used including induction coils wound on the outside of the Dewar 18, flux-gate magnetometers mounted on the outside of the Dewar, Hall-effect magnetometers similarly mounted, or the like. In each case the detector rotates with the superconducting magnet 14.

For short duration missions the cryogenic circuit may be eliminated so long as the Dewar 18 is properly vented. Thus, a fully charged, well made super-insulated Dewar can maintain cryogenic temperatures without the constant circulation of helium.

The prior discussion of the CAD system assumed that the superconducting magnet 14 was "pumped up", i.e., already had a constant persistent current flowing through the superconducting winding 16. However, a flux pump may be included in a field system so the superconducting magnet can be pumped up during operations, or where desired its moment, M, changed at any time.

Thus, the present invention provides a conductivity anomaly detection system which uses a superconducting magnet and integral detection coils rotating together to detect the second harmonic signal of the rotation frequency induced in targets in the ocean.

What is claimed is:

1. A conductivity anomaly detection system comprising:
    a direct current superconducting electromagnet mounted in a moving vehicle within a cryogenic housing for producing a dipole field;
    means coupled to said housing for continuously rotating said housing and said electromagnet and its resultant dipole field around a predetermined axis at a predetermined frequency in the direction of motion of said vehicle to produce a rotating magnetic field in the medium over which said vehicle is moving and
    sensing means within said housing rigidly mounted in relation to and rotating with said electromagnet for measuring the magnetic field resulting from currents induced in a conducting body of interest located within said medium by said rotating electromagnet.

2. A conductivity anomaly detection system as recited in claim 1 wherein said sensing means comprises:
    a set of three, mutually orthogonal, superconducting magnetic flux transformer loops.
    a set of three superconducting magnetometers (SQUID) positioned inside a magetic shield,
    each of said loops being connected separately to one of said magnetometers.

3. A conductivity anomaly detection system as recited in claim 1 wherein said detecting means comprises:
    one of the superconducting windings of said superconducting electromagnet; and
    means for detecting the second harmonic of said electromagnet rotation frequency which is induced by said conducting body of interest, said second harmonic being superimposed upon the current flowing in said winding of the superconducting magnetic.

4. A conductivity anomaly detection system as recited in claim 3 wherein said second harmonic detecting means comprises a toroidal transformer wound around said superconducting winding.

5. A conductivity anomaly detection system as recited in claim 3 wherein said second harmonic detecting means comprises:
    a superconducting magnetic shield enclosing a superconducting magnetomer (SQUID);
    said one of the superconducting windings being configured to have a portion surrounded by said superconducting magnetic shield;
    a cryogenic d.c. transformer loop about the portion of said superconducting winding that is within said magnetic shield; and
    said superconducting magnetometer being connected to the output of said cryogenic d.c. transformer loop.

6. A conductivity anomaly detection system as recited in claim 1 wherein said cryogenic housing comprises a Dewar within which said superconducting electromagnet and said sensing means are rigidly mounted.

7. A conductivity anomaly detection system as recited in claim 6 wherein said rotating means comprises:
    a hollow shaft upon which said Dewar is rigidly mounted, said hollow shaft providing the means for injecting liquid helium into said Dewar and for venting gaseous helium from said Dewar; and
    a motor mechanically connected to said hollow shaft by non-conducting, non-magnetic means such that said motor causes the said hollow shaft and attached Dewar to rotate at said predetermined frequency.

* * * * *